United States Patent [19]
Shinozaki

[11] Patent Number: 5,379,208
[45] Date of Patent: Jan. 3, 1995

[54] HIGH SPEED DRIVING CIRCUIT FOR MAGNETIC HEAD EFFECTIVE AGAINST FLYBACK PULSE

[75] Inventor: Eiji Shinozaki, Tokyo, Japan
[73] Assignee: NEC Corporation, Tokyo, Japan
[21] Appl. No.: 132,831
[22] Filed: Oct. 7, 1993
[30] Foreign Application Priority Data
Oct. 7, 1992 [JP] Japan .................. 4-268295
[51] Int. Cl.$^6$ .................. H02M 3/24; H03K 3/01
[52] U.S. Cl. .................. 363/97; 327/110
[58] Field of Search .................. 363/74, 78, 80, 95, 363/97, 98; 307/270, 446, 570; 360/46, 67, 68
[56] References Cited

U.S. PATENT DOCUMENTS

| | | | |
|---|---|---|---|
| 4,937,802 | 6/1990 | Omori et al. | 363/98 |
| 5,155,387 | 10/1992 | Fletcher et al. | 307/446 |
| 5,280,196 | 1/1994 | Shinozaki | 307/270 |

FOREIGN PATENT DOCUMENTS 62-223805 10/1987 Japan .................. 307/270

*Primary Examiner*—Steven L. Stephan
*Assistant Examiner*—Matthew Nguyen
*Attorney, Agent, or Firm*—Sughrue, Mion, Zinn, Macpeak & Seas

[57] ABSTRACT

A driving circuit for a magnetic head incorporated in a disk memory system comprises a signal source unit for producing a pair of primary driving pulse signals complementary to each other, a level shifter for producing a pair of secondary driving pulse signals complementary to each other, a switching network responsive to the primary and secondary driving pulse signals for alternating the direction of current flowing into the magnetic head and a controller operative to detect the leading edge of one of the primary driving pulse signals for providing an auxiliary current path in every transient period for changing the direction of current, and the switching network is implemented a bridge circuit, i.e., four bipolar transistors respectively responsive to the primary and secondary driving pulse signals, wherein the auxiliary current path allows one of the secondary driving pulse signals to be temporally pulled down for keeping the associated bipolar transistor off against a positive going flyback pulse, thereby decreasing the current consumption without sacrifice of the switching speed.

9 Claims, 3 Drawing Sheets

HIGH SPEED DRIVING CIRCUIT FOR MAGNETIC HEAD EFFECTIVE AGAINST FLYBACK PULSE

FIELD OF THE INVENTION

This invention relates to a driving circuit for a magnetic head and, more particularly, to a high-speed driving circuit effective against a flyback pulse for achieving a high speed switching action.

DESCRIPTION OF THE RELATED ART

A typical example of the driving circuit suitable for the two port magnetic head is illustrated in FIG. 1 of the drawings, and largely comprises a switching network 1 coupled with a magnetic head 2, a level shifter 3 and a pair of signal sources 4.

The switching network 1 comprises a bridge circuit 1a and a constant current source 1b, and the switching network 1 changes the direction of current flowing into the magnetic head 2. Namely, the switching network 1a is implemented by two series combinations of bipolar transistors Q1/Q2 and Q3/Q4, and the collector nodes of the bipolar transistors Q1 and Q3 are connected with a power voltage line Vcc. Output nodes OUT1 and OUT2 of the switching network 1 are respectively connected between the emitter node of the bipolar transistor Q1 and the collector node of the bipolar transistor Q2 and between the emitter node of the bipolar transistor Q3 and the collector node of the bipolar transistor Q4, and the magnetic head 2 is coupled between the output nodes OUT1 and OUT2.

The constant current source 1b is implemented by a series of bipolar transistor Q5 and a resistor R1 connected between the emitter nodes of the bipolar transistors Q2 and Q4 and a ground voltage line GND.

The level shifter 3 supplies a control signal CNT and a complementary control signal CCNT different to the base nodes of the bipolar transistors Q1 and Q3, and the bipolar transistors Q1 and Q3 are complementarily switched on and off for supplying current to either output node OUT1 or OUT2.

On the other hand, the emitter nodes of the bipolar transistors Q2 and Q4 are connected through the constant current source 1b with a ground voltage line GND, and the pair of signal sources 4 supplies a driving signal DR and a complementary driving signal CDR to the base nodes of the bipolar transistors Q2 and Q4. The driving signal DR and the complementary driving signal CDR complementarily switch the bipolar transistors Q2 and Q4 on and off, and the bipolar transistors Q2 and Q4 discharges from either output node OUT2 or OUT1 through the constant current source 1b to the ground voltage line GND.

The level shifter 3 is implemented by a differential amplifier, and comprises two series combinations of resistors R2/R3 and bipolar transistors Q6/Q7 and a constant current source 3a. The two series combinations are connected between the power source line Vcc and the constant current source 3a, and the constant current source 3a is implemented by a series of a bipolar transistor Q8 and a resistor R4. Though not shown in FIG. 1, the base nodes of the bipolar transistors Q5 and Q8 are connected with an input circuit (not shown).

The base nodes of the bipolar transistors Q6 and Q7 are connected with the pair of signal sources 4, and the collector nodes of the bipolar transistors Q6 and Q7 are connected with the base nodes of the bipolar transistors Q1 and Q3, respectively. The driving signal DR and the complementary driving signal CDR complementarily switch the bipolar transistors on and off, and, for this reason, the control signal CNT and the complementary control signal CCNT are produced from the driving signal DR and the complementary driving signal CDR, respectively.

The pair of signal sources 4 is positively biased by an appropriate power source 5, and alternates the driving signal DR and the complementary driving signal CDR with the peak-to-peak amplitude of 0.25 volt and the phase difference at 180 degrees.

The circuit behavior of the prior art driving circuit is hereinbelow microscopically described. Assuming now that the pair of signal sources 4 changes the driving signal DR and the complementary driving signal CDR to high voltage level and low voltage level, the bipolar transistors Q6 and Q2 turn on, and the bipolar transistors Q7 and Q4 turn off.

The current passing through bipolar transistor Q6 pulls down the voltage level at the collector node thereof, and any voltage drop does not take place at the collector node of the bipolar transistor Q7 in the off-state. This results in the control signal CNT of the low voltage level and the complementary control signal CCNT of the high voltage level. Thus, the level shifter 3 supplies the control signal CNT of the low voltage level and the complementary control signal CCNT of the high voltage level to the base nodes of the bipolar transistors Q1 and Q3, and the bipolar transistors Q1 and Q3 turn off and on, respectively.

For this reason, the switching network 1 establishes a charging path from the power voltage line Vcc to the output node OUT2 and a discharging path from the output node OUT1 to the constant current source 1b.

On the other hand, if the pair of signal sources 4 changes the driving signal DR and the complementary driving signal CDR to the low voltage level and the high voltage level, the bipolar transistors Q7 and Q4 turn on, and the bipolar transistors Q6 and Q2 turn off.

The current passing through bipolar transistor Q7 pulls down the voltage level at the collector node thereof, and the bipolar transistor Q6 in the off-state allows the voltage level at the collector node thereof to recover from the low voltage level to the high voltage level. This results in the control signal CNT of the high voltage level and the complementary control signal CCNT of the low voltage level. Thus, the level shifter 3 alternates the control signal CNT and the complementary control signal CCNT, and the control signal CNT and the complementary control signal CCNT switches the bipolar transistors Q1 and Q3 on and off, respectively.

As a result, the switching network 1 establishes the charging path from the power voltage line Vcc to the output node OUT1 and the discharging path from the output node OUT2 to the constant current source 1b.

Thus, the switching network 1 changes the charging path and the discharging path in synchronism with the alternation of the driving signal DR, and the magnetic head is magnetized in opposite polarity.

The switching network 1 microscopically behaves in the transient period for changing the direction of current as follows. Assuming now that the bipolar transistors Q1 and Q4 are turned on, the current is flowing from the output node OUT1 through the magnetic head 2 to the output node OUT2. When the pair of signal sources 4 changes the driving signal DR and the complementary driving signal CDR, the switching network 1 microscopically changes the charging path and the discharging path to the output node OUT2 and the output node OUT1, respectively.

However, in the transient period, the magnetic head 2 produces a positive going flyback pulse, and the positive going flyback pulse causes the output node OUT2 to go up with respect to the output node OUT1. The positive going flyback pulse lifts the emitter node of the bipolar transistor Q3, and the bipolar transistor Q3 undesirably turns off. On the contrary, the voltage level at the output node OUT1 pulled down due to the positive going flyback pulse is propagated to the emitter node of the bipolar transistor Q1, and the bipolar transistor Q1 undesirably turns on. As a result, the current flows from the bipolar transistor Q1 through the bipolar transistor Q2 to the constant current source 1b without passing through the magnetic head 2. While any current is not flowing into the magnetic head 2, the magnetic head can not record any data on a magnetic recording medium, and suffers from a low recording speed.

In order to prevent the switching network from it, the positive going flyback pulse is clamped at a certain voltage level which prohibits the bipolar transistor Q1 from turn-on. For this reason, the current switching speed is restricted to a value not allowing the bipolar transistor Q1 to turn on.

In the magnetic recording, a higher current switching speed results in a larger output voltage from the magnetic head in the read-out, the interference between the recording signals are decreased, the error rate is decreased, and the recording density is increased. A higher current switching speed is achieved by preventing the positive going flyback pulse from the clamp at low voltage level. Namely, in the prior art circuit shown in FIG. 1, in order not to clamp the positive going flyback pulse at low voltage level, it is recommendable to lower the base voltage level of the bipolar transistor Q1 for preventing the bipolar transistor Q1 from the clamp at the lower voltage level even if the positive going flyback pulse pulls down the emitter voltage. Larger resistance of the resistor R2 or much current of the constant current source 3a pulls down the base voltage of the bipolar transistor Q1.

However, the amount of current flowing from the emitter of the bipolar transistor Q1 into the magnetic head 2 is equal to the amount of current passing through the constant current source 1b, and is of the order of 20 milliamperes. If the bipolar transistor Q1 has the minimum common-emitter forward-current transfer ratio $h_{FE}$ of 50, the maximum base current is about 0.4 milliampere.

As described hereinbefore, the bipolar transistor Q3 turns off due to the positive going flyback pulse produced at the current switching, and any current is not supplied to the magnetic head 2 due to the bipolar transistor Q3 in turn-off. This results in that the current switching speed is decreased.

Namely, if the base voltage of the bipolar transistor Q3 in the on-state is made as high as possible and the flyback pulse is made large for causing the bipolar transistor Q3 to hardly turn on, the current switching speed becomes high. This is correct for the bipolar transistor Q1 in the opposite current direction. As described hereinbefore, the maximum base current of the bipolar transistor Q1 is about 0.4 milliampere, and a lower base voltage of the bipolar transistor Q1 is desirable in the off-state. Therefore, when the constant current source 3a flows a small amount of current, the resistance of the resistor R2 must be large. On the contrary, when the resistance of the resistor R1 is small, the constant current source 3a must flow a large amount of current. If the emitter-base forward bias voltage of the bipolar transistor in on-state is 0.7 volt, the resistance of the resistor R2 is 500 ohms, the emitter voltage of the bipolar transistor Q1 in the off-state is 1.5 volts and the power voltage is 5 volts, the constant current source 3a needs to pass the current of 5.6 milliamperes. The switching network 1 is assumed to be stable after the current switching. In this situation, the resistance of the magnetic head 2 against the direct current is about zero ohm, and the bipolar transistors Q1 and Q3 form a differential amplifier. If the difference between the base voltages is not greater than 0.1 volt, most of the current flowing into the constant current source 1b passes through either bipolar transistor Q1 or Q3.

The resistances of each resistor R2 or R3 is assumed to be 500 ohms, and the constant current source 3a is expected to flow the current equal to or greater than 200 micro-ampere. Therefore, if the current of the constant current source 3a is large enough to continuously supplying current into the magnetic head 2 against the flyback pulse at the current switching, the current is wasted in the stable state.

SUMMARY OF THE INVENTION

It is therefore an important object of the present invention to provide a driving circuit for a magnetic head which is free from the undesirable influences of the positive going flyback pulse without increase of the current consumption.

To accomplish the object, the present invention proposes to temporally change a secondary driving pulse signal at transient timing for keeping a control node lower than a threshold of the associated transistor.

In accordance with the present invention, there is provided a driving circuit for a magnetic head having first and second current nodes, comprising: a) switching network having a series combination of first and second transistor connected between a first source of voltage and a first common node, a series combination of third and fourth transistors connected between the first source of voltage and the first common node and a first constant current source connected between the first common node and a second source of voltage different in voltage level from the first voltage source, the first and second current nodes being connected between the first transistor and the second transistor and between the third transistor and the fourth transistor, respectively; b) a level shifter operative to produce a pair of secondary driving pulse signals complementary to each other from a pair of primary driving pulse signals complementary to each other, and supplying the secondary driving pulse signals to control nodes of the first and third transistors, respectively; c) a signal source unit operative to produce the primary driving pulse signals having respective leading edges, and supplying the primary driving pulse signals to the level shifter and to control nodes of the second and fourth transistors so that a charging path and a discharging path are provided from the first source of voltage to one of the current nodes and from the other of the current nodes to the second source of voltage, respectively; and d) a controller operative to detect the leading edges of the primary driving pulse signals so as to cause the level shifter to temporally change the voltage level of one of the secondary driving pulse signals in a transient period for changing the direction of current flowing into the magnetic head, thereby preventing the first or third bipolar transistor from turn-on due to a positive going flyback pulse produced in the transient period by the magnetic head.

BRIEF DESCRIPTION OF THE DRAWINGS

The features and advantages of the driving circuit according to the present invention will be more clearly understood from the following description taken in conjunction with the accompanying drawings in which.

DESCRIPTION OF THE PREFERRED EMBODIMENTS

First Embodiment

Figure 1:
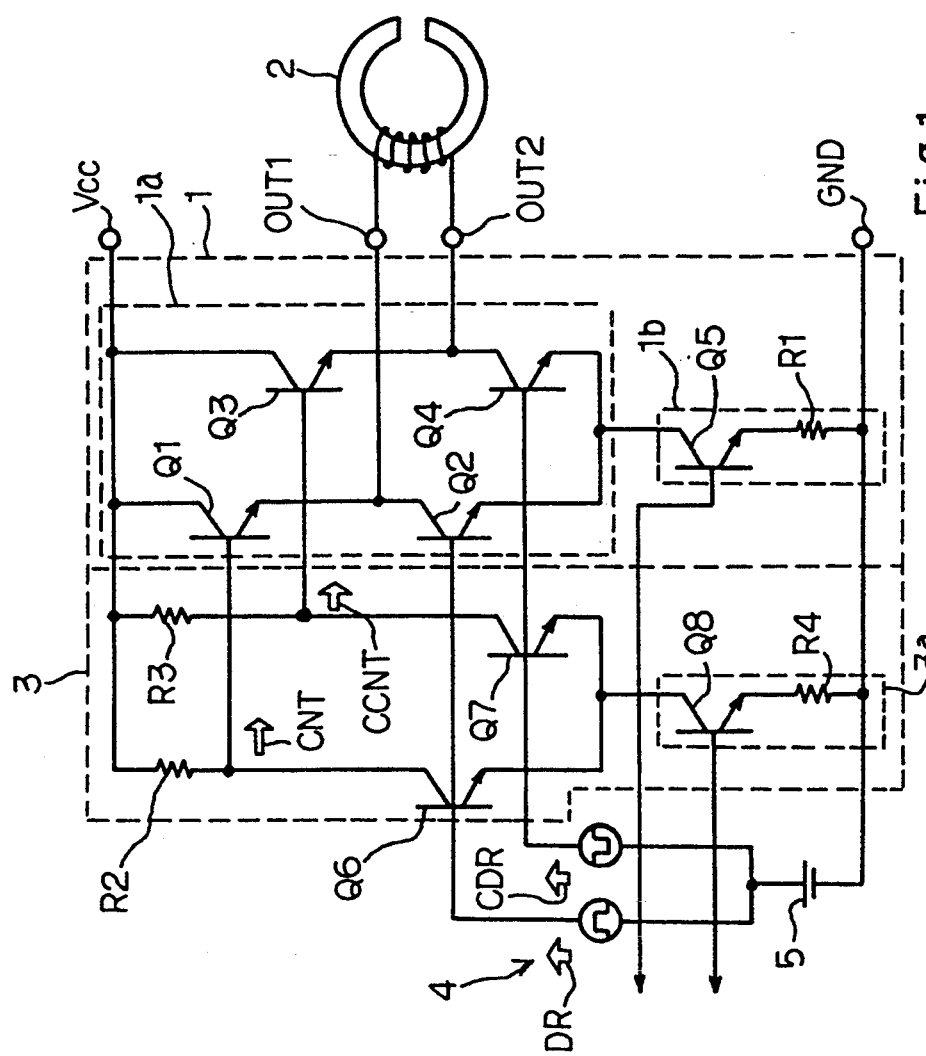
FIG. 1 is a circuit diagram showing the circuit arrangement of the prior art driving circuit for the magnetic head.
Figure 2:
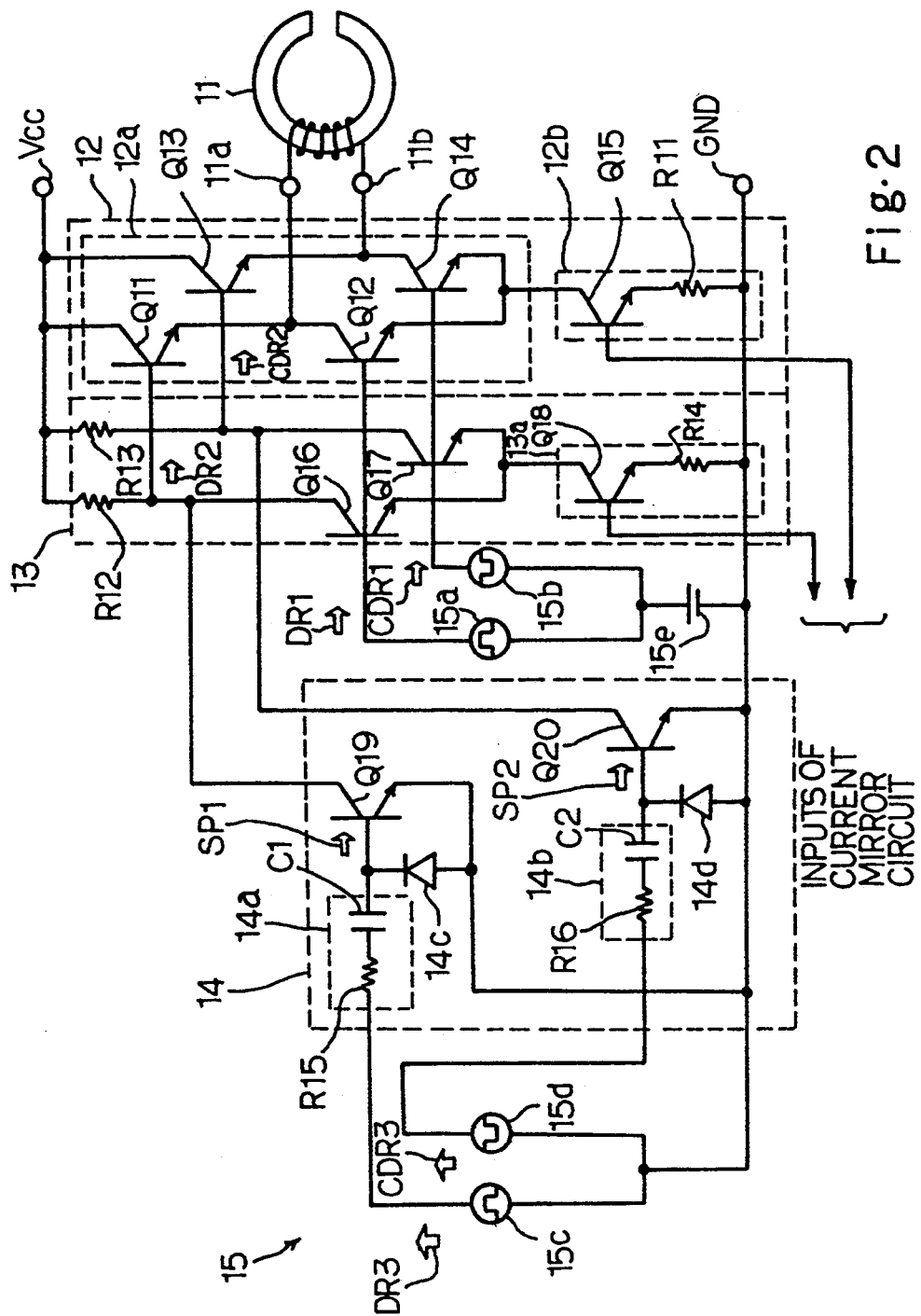
FIG. 2 is a circuit diagram showing the circuit arrangement of a driving circuit for a magnetic head according to the present invention.

Referring to FIG. 2 of the drawings, a driving circuit embodying the present invention is associated with a two port magnetic head 11 such as, for example, a thin-film magnetic head incorporated in a disk drive system. Though not shown in the drawings, the disk drive system records data in a magnetic recording medium such as a floppy disk or a hard disk, and reproduces signals indicative of the recorded data.

The driving circuit shown in FIG. 2 largely comprises a switching network 12, a level shifter 13, a controller 14 and a signal source 15, and the switching network 12 provides a charging path between a power source line Vcc and one of the two current nodes 11a and 11b of the magnetic head 11 as well as a discharging path between the other of the two current nodes 11a and 11b in in response to a pair of primary driving signals DR1 and CDR1 complementary to each other.

The switching network 12 comprises a bridge circuit 12a and a constant current source 12b, and the switching network 12a changes the direction of current flowing into the magnetic head 11. Namely, the switching network 12a is implemented by two series combinations of bipolar transistors Q11/Q12 and Q13/Q14, and the collector nodes of the bipolar transistors Q11 and Q13 are connected with the power voltage line Vcc. The current nodes 11a and 11b of the magnetic head are respectively connected between the emitter node of the bipolar transistor Q11 and the collector node of the bipolar transistor Q12 and between the emitter node of the bipolar transistor Q13 and the collector node of the bipolar transistor Q14, and the constant current source 12b is connected between the emitter nodes of the bipolar transistors Q12 and Q14 and the ground voltage line GND.

The constant current source 12b is implemented by a series of bipolar transistor Q15 and a resistor R11, and the base node of the bipolar transistor Q15 is connected with one of the inputs of a current mirror circuit (not shown).

The level shifter 13 produces a pair of secondary driving signals DR2 and CDR2 respectively complementary to each other from the primary driving signals DR1 and CDR1, and supplies the secondary driving signals DR2 and CDR2 to the base nodes of the bipolar transistors Q11 and Q13. The secondary driving signals complementarily switch on and off the bipolar transistors Q11 and Q13 for supplying current from the power voltage line Vcc to either current node 11a or 11b. The primary driving signals DR1 and CDR2 are identical with those of the prior art.

Namely, the level shifter 13 is implemented by a differential amplifier, and comprises two series combinations of resistors R12/R13 and bipolar transistors Q16/Q17 and a constant current source 13a. The two series combinations are connected between the power source line Vcc and the constant current source 13a, and the constant current source 13a is implemented by a series of a bipolar transistor Q18 and a resistor R14. The constant current source 13a is smaller in current driving capability than the constant current source 3a of the prior art driving circuit, and the constant current passing therethrough is about 2 milliamperes. The base node of the bipolar transistor Q18 is connected with the other input of the current mirror circuit (not shown).

The base nodes of the bipolar transistors Q16 and Q17 are connected with the signal source 14, and the primary driving signals DR1 and CDR1 are supplied to the base nodes of the bipolar transistors Q16 and Q17, respectively. The bipolar transistors Q16 and Q17 are responsive to the primary driving signals DR1 and CDR1 for producing the secondary driving signals DR2 and CDR2 at the collector nodes thereof, and the collector nodes of the bipolar transistors Q16 and Q17 are connected with the base nodes of the bipolar transistors Q11 and Q13, respectively. For this reason, the secondary driving signals DR2 and CDR2 complementarily switch the bipolar transistors Q11 and Q12 on and off. The secondary driving signals DR2 and CDR2 are anti-phase signals of the primary driving signals DR1 and CDR1, respectively, and, accordingly, either bipolar transistor Q11 or Q13 and either bipolar transistor Q14 or Q12 provide the charging path and the discharging path.

The controller 14 comprises differentiating circuits 14a and 14b, bipolar discharging transistors Q19 and Q20 and diodes 14c and 14d, and is operative to provide an auxiliary discharging path in parallel to the constant current source 13a in every transient period for changing the direction of current flowing into the magnetic head 11.

Namely, the differentiating circuit 14a comprises a resistor R15 and a capacitor C1 coupled in series, and the other differentiating circuit 14b also comprises a resistor R16 and a capacitor C2. Auxiliary driving signals DR3 and CDR3 complementary to each other are supplied from the signal source 15 to the differentiating circuits 14a and 14b, respectively, and the auxiliary driving signals DR3 and CDR3 are in-phase signals with respect to the primary driving signals DR1 and CDR1. When the primary driving signal DR1 or CDR1 starts rising toward a high level, the auxiliary driving signal DR3 or CDR3 also starts rising toward the high voltage level, and either differentiating circuit 14a or 14b acknowledges the leading edge of the auxiliary driving signal DR3 or CDR3 for producing a spike pulse SP1 or SP2.

The collector nodes of the bipolar discharging transistor Q19 and Q20 are respectively connected between the resistor R12 and the collector node of the bipolar transistor Q16 and between the resistor R13 and the collector node of the bipolar transistor Q17, and the emitter nodes of the bipolar discharging transistors Q19 and Q20 are connected with the ground voltage line GND. The base nodes of the bipolar discharging transistors Q19 and Q20 are connected with the differentiating circuits 14a and 14b, respectively, and, accordingly, one of the spike pulse signals SP1 and SP2 is supplied to the base node of the associated bipolar discharging transistor Q19 or Q20 in every transient period for changing the direction of the current. One of the bipolar discharging transistor Q19 or Q20 turns on in response to the spike pulse signal SP1 or SP2, and the amount of current flowing into the level shifter 13 is temporally increased. The diodes 14c and 14d have respective cathodes connected with the base nodes of the bipolar discharging transistors Q19 and Q20 and respective anodes connected with the ground voltage line GND.

The signal source 15 comprises a first pair of signal sources 15a and 15b for producing the primary driving signals DR1 and CDR1 and a second pair of signal sources 15c and 15d for producing the auxiliary driving signals DR3 and CDR3. The first pair of signal sources 15a and 15b is positively biased by an appropriate power source 15e, and alternates the primary driving signals DR1 and CDR1 between a positive low voltage level and a positive high voltage level. The amplitude of the primary driving signals DR1 and CDR1 is 0.25 volt between the peak to peak, and the phase is different at 180 degrees.

The second pair of signals sources 15c and 15d are connected between the ground voltage line GND and the differentiating circuits 14a and 14b, and alternate the auxiliary driving signals DR3 and CDR3 between the ground voltage level and a certain positive high voltage. The pulse height of the auxiliary driving signals DR3 and CDR3 is larger than the emitter-base forward bias voltage of the bipolar transistors. The primary and auxiliary driving signals DR1/CDR1 and DR3/CDR3 are square pulses, and the primary driving signals DR1/CDR1 alternate in synchronism with the auxiliary driving signals DR3/CDR3.

In operation, assuming now that the signal sources 15a and 15c keeps the primary driving signal DR1 and the auxiliary driving signal DR3 in the high voltage level, the bipolar transistors Q16 and Q12 turn on, and the secondary driving signal CDR2 of the high voltage level causes the bipolar transistors Q13 to turn on. However, the bipolar transistors Q17, Q14 and Q11 are turned off, and the charging path and the discharging path are provided from the positive power voltage line Vcc to the current node 11b and from the current node 11a through the constant current source 12b to the ground voltage line GND. The spike pulses SP1 and SP2 have been already removed, and the bipolar discharging transistors Q19 and Q20 are turned off. Therefore, relatively small amount of current flows from the positive power voltage line Vcc through the resistor R12 and the bipolar transistor Q16 into the constant current source 13a, and the voltage level at the base node of the bipolar transistor Q11 is higher than the prior art.

When the primary driving signal DR1 and the auxiliary driving signal DR3 are changed to the respectively low voltage levels and the primary driving signal CDR1 and the second auxiliary driving driving signal CDR3 start rising toward the respective high voltage levels, the bipolar transistors Q16, Q12 and Q13 turn off, and the bipolar transistors Q17, Q14 and Q11 turn on. As a result, the charging path and the discharging path are established through the bipolar transistor Q11 to the current node 11a and from the current node 11b through the bipolar transistor Q14 to the constant current source 12b, and a positive going flyback pulse takes place.

However, the bipolar transistors Q11 and Q13 are free from the undesirable influences of the positive going flyback pulse, because the level shifter 13 temporally lowers the base node of the bipolar transistor Q13. In detail, the primary driving signals DR1 and CDR1 cause the bipolar transistors Q12 and Q14 to turn off and on, and the positive going flyback pulse causes the current nodes 11a and 11b to go up and down, respectively. The current node 11b thus lowered pulls down the emitter node of the bipolar transistor Q13.

On the other hand, the differentiating circuit 14b detects the leading edge of the auxiliary driving signal CDR3, and supplies the spike pulse SP2 to the bipolar discharging transistor Q20. While the spike pulse SP2 is being produced in the transient period, the bipolar discharging transistor Q20 is turned on, and connects the resistor R13 with the ground voltage line GND. This results in that the current passing through the resistor R13 is increased, and the potential drop across the resistor R13 becomes large. This means that the base node of the bipolar transistor Q13 is pulled down, and the bipolar transistor Q13 keeps off in spite of the potential drop at the current node 11b due to the positive going flyback pulse.

When the primary driving signal CDR1 reaches the high voltage level, the auxiliary driving signal CDR3 also reaches the high voltage level, and the spike pulse SP2 is removed from the base node of the bipolar discharging transistor Q20. Then, the bipolar discharging transistor Q20 turns off, and the current passes through the constant current source 13a only. For this reason, although the voltage level at the base node of the bipolar transistor Q13 is slightly lifted, the positive going flyback pulse has been already removed, and the bipolar transistor Q13 keeps off.

Thus, even if the positive going flyback pulse takes place, any through-current does not flow through the series of bipolar transistors Q13/Q14, and high-speed bipolar transistors are available for the bridge circuit 12a. While the bridge circuit 12a is keeping the current direction, the current flows only through the constant current source 13a, and the current consumption is drastically decreased.

Additionally, the bipolar transistors Q16 and Q17 and the bipolar transistors Q11 and Q12 serve as a first differential amplifier and a second differential amplifier, respectively.

Second Embodiment

Figure 3:
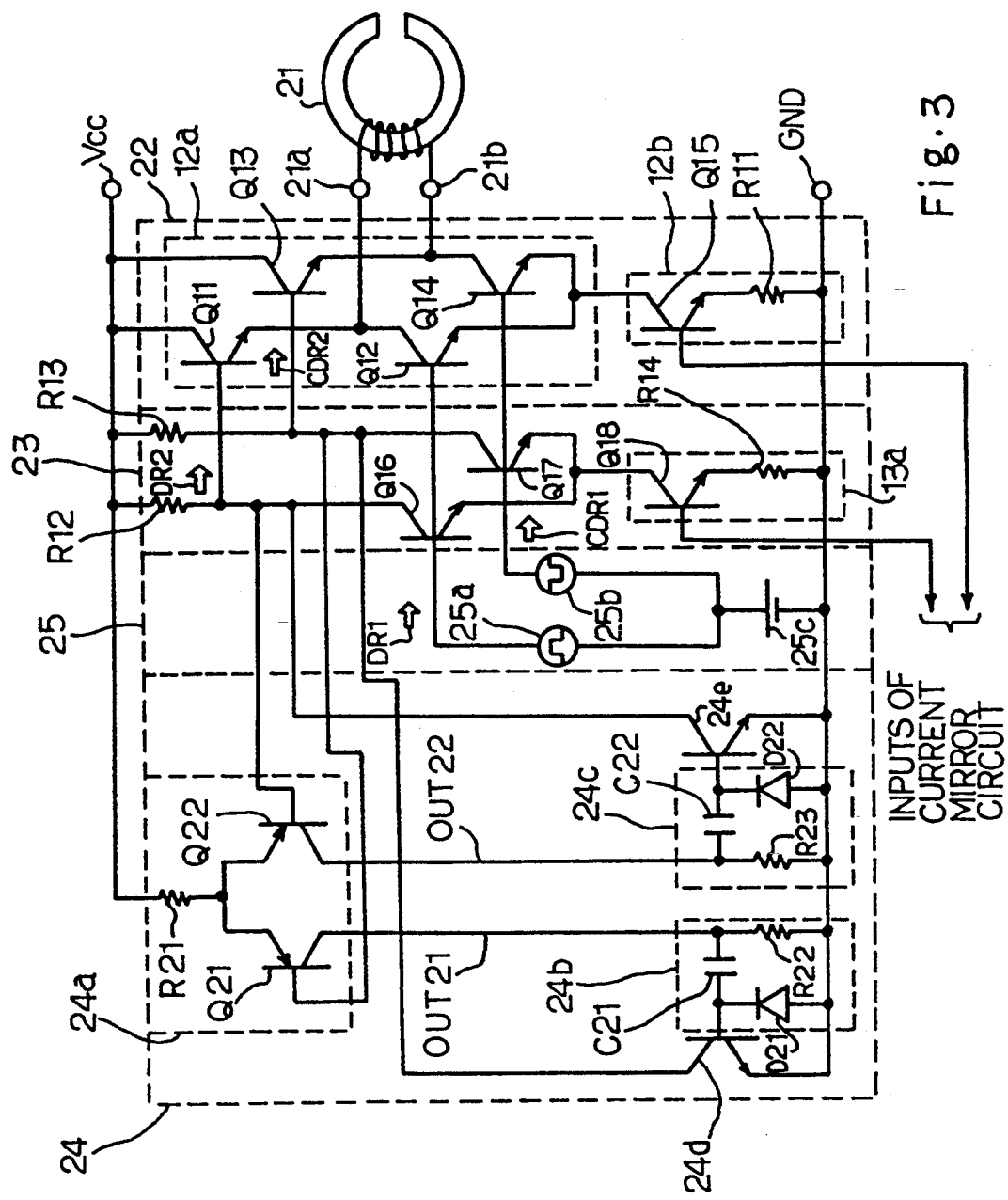
FIG. 3 is a circuit diagram showing the circuit arrangement of another driving circuit for a magnetic head according to the present invention.

Turning to FIG. 3 of the drawings, another driving circuit embodying the present invention is associated with a magnetic head 21. The driving circuit largely comprises a switching network 22, a level shifter 23, a controller 24 and a signal source 25, and the switching network 22 and the level shifter 23 are similar to the switching network 12 and the level shifter 13 of the first embodiment. For this reason, the circuit components of the switching network 22 and the level shifter 23 are labeled with those of the switching network 12 and the level shifter 13, and description thereon is omitted for the sake of simplicity.

The signal source 25 is implemented by a pair of signal sources 25a and 25b positively biased by means of an appropriate power source 25c, and produces a pair of primary driving signals DR1 and CDR1 corresponding to the primary driving signals of the first embodiment.

The controller 24 comprises a voltage comparator 24a, timer circuits 24b and 24c, and bipolar discharging transistors 24d and 24e, and increases current flowing into the resistor R12 or R13 in every transient period for changing the direction of current flowing into the magnetic head 21.

Namely, the voltage comparator 24a comprises a resistor R21 connected with the power voltage line Vcc and bipolar transistors Q21 and Q22 having a common collector node connected with the resistor R21. Although all of the component transistors of the switching network 22 and the level shifter 23 are of the n-p-n type, the bipolar transistors Q21 and Q22 are of the p-n-p type. The base nodes of the bipolar transistors Q21 and Q22 are respectively connected with the collector nodes of the bipolar transistors Q17 and Q16, and the collector nodes of the bipolar transistors Q21 and Q22 are respectively connected with output signal lines OUT21 and OUT22. The emitter-base forward bias voltage of the bipolar transistors Q21 and Q22 is about 0.7 volt, and each of the resistors R12 and R13 is adjusted to 500 ohms. The constant current source 13a allows current to pass therethrough at 2 milliamperes.

Each of the timer circuits 24b and 24c comprises a resistor R22 or R23 connected between the output signal line OUT21 or OUT22 and the ground voltage line GND, a capacitor C21 or C22 connected between the output signal line OUT21 or OUT22 and the base node of the bipolar discharging transistor 24d or 24e and a diode D21 or D22 connected between the ground voltage line GND and the base node of the bipolar discharging transistor 24d or 24e. Each of the resistors R22 and R23 provides 3 to 10 ohms against the collector current of the bipolar transistor Q21 or Q22.

In operation, assuming that the primary driving signals DR1 and DR2 are in the high voltage level and the low voltage level, respectively, the bipolar transistors Q12, Q13 and Q16 are turned on, and the bipolar transistors Q11, Q14 and Q17 are turned off. For this reason, current flows into the current node 21b, and is discharged from the current node 21b. The resistor R21 pulls down the voltage level at the common emitter node of th bipolar transistors Q21 and Q22 by 0.3 volt, and the bipolar transistor Q22 is turned on. Current flows through the bipolar transistor Q22, and the voltage level at the collector node is 1 volt lowr than the powr voltage line Vcc. The current does not flow into the capacitor C22 in the stable state, and the other capacitor C21 is evacuated.

Now, the signal sources 25a and 25b altrenate the primary driving signals DR1 and CDR1 to the low voltage level and the high voltage level, and the current flows from the current node 21a through the magnetic head 21 to the current node 21b. When the current changes the direction, a positive going flyback pulse takes place, and causes the current nodes 21a and 21b to go up and to go down. Therefore, the bipolar transistor Q11 starts to turn off, and the bipolar transistor Q13 starts to turn on. However, the controller 24 does not allow the bipolar transistor Q13 to turn on.

The switching action of the switching network 22 as well as the behavior of the comparator 24a are microscopicaly described hereinbelow. When the signal sources 25a and 25b alternate the primary driving signals DR1 and CDR1, the bipolar transistor Q16 turns off, and the bipolar transistor Q17 turns on. Then, the collector node of the bipolar transistor Q16 goes up, and the collector node of the bipolar transistor Q17 goes down by 1 volt lowr than the powr voltage level Vcc. The bipolar transistor Q22 turns off, and the bipolar transistor Q21 turns on. Current flows through the bipolar transistor Q21 into the output signal line OUT21, and the resistor R22 causes the node between the capacitor C21 and the output signal line OUT21 to go down. As a result, current flows into the base node of the bipolar discharging transistor 24d, and the bipolar dischargig transistor 24d turns on. This means that an auxiliary current path is established from the resistor R13 to the ground votlage line GND, and the resistor R13 pulls down the voltage level at the base node of the bipolar transistor Q13. Thus, even if the current node 21b and, accordingly, the emitter node of the transistor Q13 go down, the voltage level at the base node is pulled down, and the bipolar tranistor Q13 remains off.

When the capacitor C21 is saturated, any base curent does not flow, and the bipolar discharging transistor 24d turns off. This means that the auxiliary current path is closed, and the base node of the bipoalr transistor Q13 is recovered to the initial level. However, the flyaback pulse has been already removed, and the bipolar transistor Q13 is kept off.

If the signal sources 25a and 25b further alternate the primary driving signals DR1 and CDR1, the bipolar discharging transistor 24e provides the auxiliary current path, and the bipolar transistor Q11 remains off.

As will be understood from the foregoing description, the driving circuit according to the present invention can increase the switching speed of the current flowing into the magnetic head without sacrifice of the current consumption.

Although particular embodiments of the present invention have been shown and described, it will be obvious to those skilled in the art that various changes and modifications may be made without departing from the spirit and scope of the present invention. For example, n-p-n bipolar transistors and p-n-p bipolar transistors are exchangeable together with the power voltage levels. Moreover, the bipolar transistors may be replaced with field effect transistors of an appropriate channel conductivity type.

What is claimed is:

1. A driving circuit for a magnetic head having first and second current nodes, comprising:
   a) a switching network having
      a series combination of first and second transistors connected between a first source of voltage and a first common node,
      a series combination of third and fourth transistors connected between said first source of voltage and said first common node and
      a first constant current source connected between said first common node and a second source of voltage different in voltage level from said first voltage source,
      said first and second current nodes being connected between said first transistor and said second transistor and between said third transistor and said fourth transistor, respectively;
   b) a level shifter operative to produce a pair of secondary driving pulse signals complementary to each other from a pair of primary driving pulse signals complementary to each other, and supplying said secondary driving pulse signals to control nodes of said first and third transistors, respectively;

c) a signal source unit operative to produce said primary driving pulse signals having respective leading edges, and supplying said primary driving pulse signals to said level shifter and to control nodes of said second and fourth transistors so that a charging path and a discharging path are provided from said first source of voltage to one of said current nodes and from the other of said current nodes to said second source of voltage, respectively; and d) a controller operative to detect said leading edges of said primary driving pulse signals so as to cause said level shifter to temporally change a voltage level of one of said secondary driving pulse signals in a transient period for changing the direction of current flowing into said magnetic head, thereby preventing said first or third bipolar transistor from turn-on due to a flyback pulse produced in said transient period by said magnetic head.

2. The driving circuit as set forth in claim 1, in which said first constant current source is implemented by a series of a fifth transistor and a first resistor connected between said first common node and said second source of voltage level.

3. The driving circuit as set forth in claim 1, in which said level shifter comprises a series combination of a first resistor and a fifth transistor connected between said first source of voltage level and a second common node, a series combination of a second resistor and a sixth transistor connected between said first source of voltage level and said second common node, and a second constant current source connected between said second common node and said second source of voltage level, said primary driving pulse signals being supplied to control nodes of said fifth and sixth transistors for producing said secondary driving pulse signals at current input nodes of said fifth and sixth transistors.

4. The driving circuit as set forth in claim 3, in which said second constant current source is implemented by a series combination of a seventh transistor and a third resistor connected between said second common node and said second source of power voltage level.

5. The driving circuit as set forth in claim 3, in which said signal source unit comprises a first pair of signal sources for producing said primary driving pulse signals, and a second pair of signal sources for producing auxiliary driving pulse signals complementary to each other from said primary driving pulse signal, said auxiliary driving pulse signals being in-phase signals of said primary driving pulse signals.

6. The driving circuit as set forth in claim 5, in which said controller comprises a first differentiating circuit responsive to one of said auxiliary driving pulse signal for producing a first spike pulse signal at the leading edge of said one of said auxiliary driving pulse signal, a second differentiating circuit responsive to the other of said auxiliary driving pulse signal for producing a second spike pulse signal at the leading edge of said other of said auxiliary driving pulse signals, a first discharging transistor responsive to said first spike pulse signal for connecting said current input node of said fifth transistor with said second source of voltage level, a second discharging transistor responsive to said second spike pulse signal for connecting said current input node of said sixth transistor with said second source of voltage level, a first diode connected between a control node of said first discharging transistor and said second source of voltage level, and a second diode connected between a control node of said second discharging transistor and said second source of voltage level.

7. The driving circuit as set forth in claim 3, in which said controller comprises a comparator operative to compare a voltage level at said current input node of said fifth transistor with a voltage level at said current input node of said sixth transistor for selectively supplying current to one of output signal lines thereof, a first timer connected with one of said output signal lines, and producing a first control signal for a predetermined time period after said current starts flowing through said one of said output signal lines, a second timer connected with the other of said output signal lines, and producing a second control signal for the predetermined time period after said current starts flowing through said other of said output signal line, a first discharging transistor responsive to said first control signal for conducting said current input node of said fifth transistor with said second source of voltage level, and a second discharging transistor responsive to said second control signal for conducting said current input node of said sixth transistor with said second source of voltage level.

8. The driving circuit as set forth in claim 7, in which said comparator is implemented by seventh and eighth transistors having a common current input node connected through a third resistor with said first source of voltage level, respective control nodes connected with said current input nodes of said fifth and sixth transistors and current output nodes respectively connected with said output signal lines.

9. The driving circuit as set forth in claim 7, in which each of said timer comprises a fourth resistor connected between the associated output signal line and said second source of voltage level, a capacitor connected between said associated output signal line and the control node of said first or second discharging transistor, and a diode connected between said second source of voltage level and said control node of said first or second discharging transistor.

* * * * *